(12) United States Patent
Wang et al.

(10) Patent No.: US 9,379,186 B1
(45) Date of Patent: Jun. 28, 2016

(54) FET STRUCTURE FOR MINIMUM SIZE LENGTH/WIDTH DEVICES FOR PERFORMANCE BOOST AND MISMATCH REDUCTION

(71) Applicant: GLOBALFOUNDRIES Inc., Grand Cayman (KY)

(72) Inventors: Qin Wang, Ballston Spa, NY (US); Min-hwa Chi, Malta, NY (US); Meixiong Zhao, Ballston Lake, NY (US); Zhaoxu Shen, Clifton Park, NY (US); Haiting Wang, Clifton Park, NY (US); Lucas M. Salazar, Malta, NY (US); Lan Yang, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/610,140

(22) Filed: Jan. 30, 2015

(51) Int. Cl.
| | |
|---|---|
| *H01L 21/302* | (2006.01) |
| *H01L 21/461* | (2006.01) |
| *H01L 29/10* | (2006.01) |
| *H01L 29/66* | (2006.01) |
| *H01L 29/423* | (2006.01) |

(52) U.S. Cl.
CPC ........ *H01L 29/1037* (2013.01); *H01L 29/4236* (2013.01); *H01L 29/66545* (2013.01)

(58) Field of Classification Search
CPC ............... H01L 21/8238; H01L 21/67075; H01L 21/02579; H01L 21/02576; H01L 21/31683; H01L 21/76205; H01L 21/3241; H01L 21/3226; H01L 27/0922; H01L 27/1104; H01L 29/435; H01L 29/7816

USPC ......... 438/700, 197, 199, 270, 706, 513, 297, 438/769; 257/288, 396, E21.006, E21.042, 257/E21.051, E21.054, E21.115, E21.126, 257/E21.127, E21.267, E21.229, E21.4, 257/E21.421, E21.545, E21.546, E21.632, 257/E21.646

See application file for complete search history.

(56) References Cited

U.S. PATENT DOCUMENTS

| | | | | |
|---|---|---|---|---|
| 8,664,054 | B2 * | 3/2014 | Zhu ..................... | H01L 29/7833 438/197 |
| 8,679,923 | B2 * | 3/2014 | Cao ................... | H01L 29/66545 438/275 |
| 8,963,251 | B2 * | 2/2015 | Lee ........................ | H01L 27/12 257/353 |
| 9,018,739 | B2 * | 4/2015 | Zhu ....................... | H01L 29/045 257/401 |
| 9,034,716 | B2 * | 5/2015 | Sun ....................... | H01L 29/401 438/298 |
| 2011/0260244 | A1 | 10/2011 | Doyle et al. | |

OTHER PUBLICATIONS

Kim et al., "Overcoming DRAM scaling limitations by employing straight recessed channel array transistors with <100> uni-axial and {100} uni-plane channels", IEEE IEDM Tech. Digest, 2005, pp. 319-322.

Kim et al., "S-RCAT (sphere-shaped-recess-channel-array transistor) technology for 70nm DRAM feature size and beyond", Symposium on VLSI Technology Digest of Technical Papers, 2005, pp. 34-35.

* cited by examiner

*Primary Examiner* — David Nhu
(74) *Attorney, Agent, or Firm* — Ditthavong & Steiner, P.C.

(57) ABSTRACT

Methods for preparing CMOS transistors having longer effective gate lengths and the resulting devices are disclosed. Embodiments include forming a dummy gate bound by spacers on opposing sides thereof, on a substrate; removing the dummy gate to form a trench between the spacers; modifying a gate channel portion of the substrate between the spacers to form inner or outer sidewalls; depositing a conformal high-k dielectric layer on the modified gate channel portion; and forming a metal gate in the trench.

18 Claims, 5 Drawing Sheets

BACKGROUND

FET STRUCTURE FOR MINIMUM SIZE LENGTH/WIDTH DEVICES FOR PERFORMANCE BOOST AND MISMATCH REDUCTION

TECHNICAL FIELD

The present disclosure relates to fabrication of CMOS transistors for semiconductor devices. In particular, the present disclosure relates to CMOS transistor structures having longer effective gate lengths for the 20 nanometer (nm) technology node and beyond.

BACKGROUND

Modern semiconductor devices are typically packed with a high density of transistors having minimum channel (gate) lengths. These devices generally exhibit short channel effects, which limit their performance. Transistors with longer channel lengths are designed to mitigate the short channel effects and off-current leakage. However, such designs typically require larger pitch size between transistors which compromises high die area utilization.

Recessed channel array transistors (RCATs) have been used where low leakage or low variation of current leakage is critical, such as in analog and memory devices. A RCAT demonstrates decreased short channel effects relative to conventional transistors having the same gate length. That is, a RCAT has a longer effective gate length and significantly lower sub-threshold slope (SS) and drain-induced barrier lowering (DIBL) voltages, hence lower off current leakage and a more controllable voltage variation.

FIG. 1 illustrates a semiconductor device 101 with a conventional complimentary metal-oxide semiconductor (CMOS) transistor and a RCAT. The device 101 includes a semiconductor substrate 103, a CMOS transistor region 105, and a RCAT region 107 separated from the CMOS transistor region by an isolation region 109. The CMOS transistor includes source/drain region 111, and the RCAT includes source/drain regions 113. The CMOS gate electrode 115 and the RCAT gate electrode 117 each include a conformal layer of a high-k dielectric material 119 and one or more layers of gate metals 121. Spacers 123 are formed on opposite sides of each of the two electrodes, and a dielectric layer 125 (serving as contact etch stop layer) and an inter-layer dielectric (ILD) 127 are formed over the substrate.

In comparison to the CMOS transistor, the RCAT has a longer path (channel length) between the source/drain regions and therefore, results in better suppression of short-channel effects. However, while RCATs are used in advanced dynamic random access memory (DRAM) devices, these are not as suitable for use in logic transistors and static random access memory (SRAM) devices due to larger threshold voltage (Vt) variations and damage on mobility caused by the methods used for their production, e.g., plasma etching, and variations of doping to the vertical channel.

The scaling of planar CMOS into 20 nm leads to growing variations of smallest transistors (usually used in SRAM arrays) and degradation in threshold voltage mismatch (Vtmm) and minimum voltage (Vmin) yield (due to fluctuations of process parameters such as critical dimensions (CD's), over-lay, random doping fluctuations, etching, and wet clean.

A need therefore exists for new methodology enabling fabrication of minimum size CMOS transistors having a longer effective channel (gate) length between the source/drain regions for suppression of short-channel effects and the resulting devices.

SUMMARY

An aspect of the present disclosure relates to a method of forming a high-k metal gate with an increased effective channel length without increasing the size of the device.

Another aspect of the present disclosure is a minimum channel high-k metal gate device with an increased effective channel length.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a dummy gate bound by spacers on opposing sides thereof, on a substrate; removing the dummy gate to form a trench between the spacers; modifying a gate channel portion of the substrate between the spacers to form inner or outer sidewalls; depositing a conformal high-k dielectric layer on the modified gate channel portion; and forming a metal gate in the trench.

Aspects of the present disclosure also include modifying the gate channel portion of the substrate by anisotropically wet etching the gate channel portion of the substrate to form a concave channel with inner sidewalls. Other aspects include anisotropically wet etching the gate channel portion of the substrate with tetramethylammonium hydroxide (TMAH or $(CH_3)_4NOH$) or ammonium hydroxide ($NH_4OH$). Still other aspects include anisotropically wet etching the gate channel portion of the substrate to a depth of 5 to 8 nm. Further aspects include having the concave channel being bounded by silicon (111) surfaces. Still further aspects include exposing the outer sidewalls of the concave channel by recessing an oxide shallow trench isolation (STI) region adjacent the concave channel. Other aspects include exposing the outer sidewalls of the concave channel to a depth of 3 to 10 nm. Still other aspects include modifying the gate channel portion of the substrate by recessing an STI region in the substrate adjacent the gate channel portion to expose outer sidewalls of the gate channel portion. Further aspects include exposing the outer sidewalls of the gate channel portion to a depth of 3 to 10 nm. Still further aspects include removing a gate oxide layer with the dummy gate to form the trench. Additional aspects include forming a gate oxide layer between the modified gate channel portion and the conformal high-k dielectric layer.

According to the present disclosure, some technical effects may be achieved in part by a device including: a substrate; a gate channel portion in the substrate having inner or outer sidewalls; a conformal high-k dielectric layer over the gate channel portion; and a metal gate with spacers at opposite sides thereof over the high-k dielectric layer.

Aspects of the present disclosure also include an anisotropically wet etched gate channel portion which forms a concave channel in the substrate with inner sidewalls. Other aspects include the inner sidewalls having a depth of 5 to 8 nm. Still other aspects include the concave channel being bounded by silicon (111) surfaces. Further aspects include having an oxide STI region adjacent to the concave channel, and the STI region recessed to expose outer sidewalls on the concave channel. Still further aspects include the exposed outer sidewalls on the concave channel having a depth of 3 to 10 nm. Other aspects include an oxide STI region in the substrate adjacent the gate channel portion recessed to expose outer sidewalls of the gate channel portion. Additional aspects include the outer sidewalls of the gate channel portion having a depth of 3 to 10 nm.

Another aspect of the present disclosure includes a method including: forming a gate oxide layer and a polysilicon dummy gate bounded by spacers on opposing sides thereof and surrounded by an interlayer dielectric (ILD) on a substrate; removing the gate oxide layer and the dummy gate to form a trench between the spacers; anisotropically wet etching a gate channel portion of the substrate between the spacers with TMAH or $NH_4OH$ to form a concave channel with inner sidewalls having a depth of 5 to 8 nm, the concave channel being bounded by silicon (111) surfaces; recessing an oxide STI region adjacent the concave channel to a depth of 3 to 10 nm to expose outer sidewalls of the gate channel portion; and depositing a high-k dielectric layer and forming a metal gate in the trench.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of increased transistor size attendant upon increasing the effective channel length between the source/drain regions for suppression of short-channel effects.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
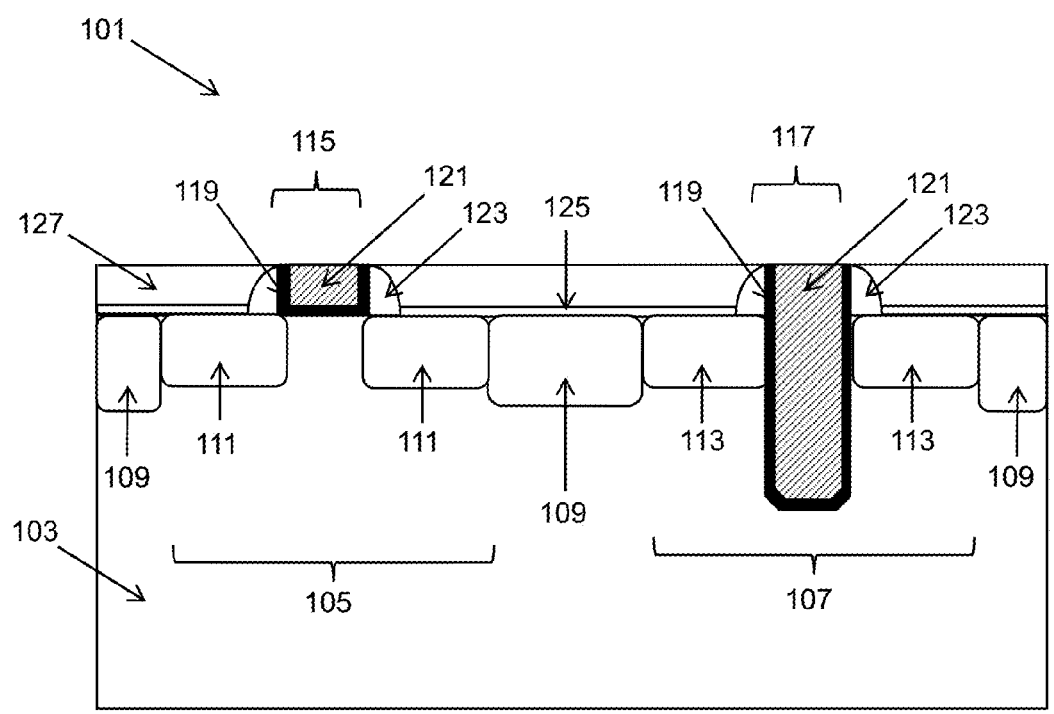
FIG. 1 illustrates a conventional CMOS transistor and a RCAT in a semiconductor device.
Figure 2A:
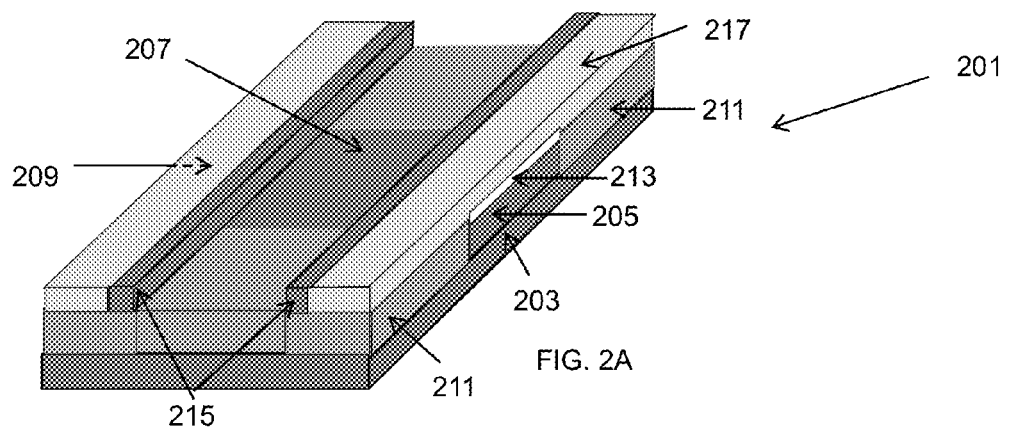
FIGS. 2A through 2C illustrate a perspective view of process steps for fabricating a planar transistor with longer effective channel length, according to an exemplary embodiment.
Figure 2B:
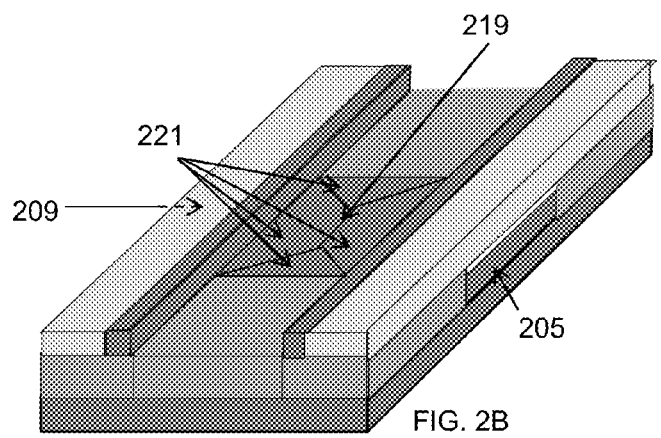
Figure 2C:
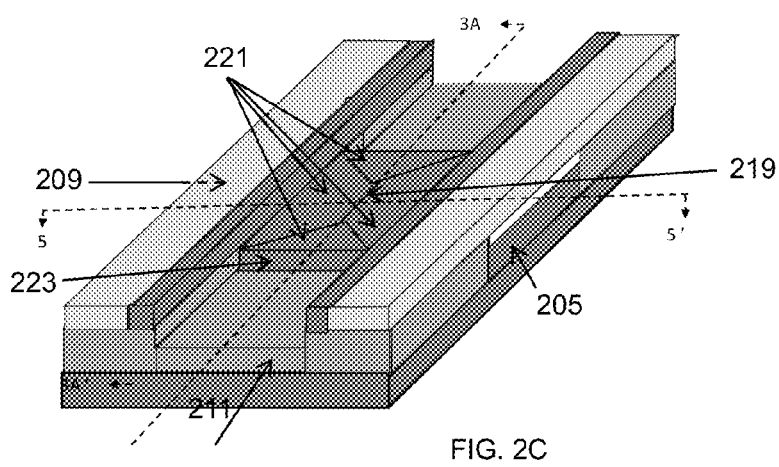

FIGS. 2A through 2C illustrate process steps for fabricating a planar transistor device with a longer effective channel (gate) length according to an exemplary embodiment.

The process flow begins with a conventional flow for bulk planar CMOS. Specifically, a semiconductor substrate 203 is patterned, forming active areas, including source region 205, channel region 207, and drain region 209, are patterned, and oxide 211 fills spaces between the active areas. N and P-wells are patterned, implanted and annealed for p-type and n-type MOSFET respectively (not shown). A gate oxide and dummy gate are formed across the channel region 207, and spacers 215 are formed on opposite sides of the dummy gate. Halo implantation is performed and doped eSiGe (for p-type) or Si-epi (for n-type raised) or doped eSiC (for n-type) source/drain regions are grown, with an epi growth portion 213. An ILD 217 is deposited, and the dummy gate is removed and the gate oxide is removed (the gate oxide is not yet formed), leaving structure 201 shown in FIG. 2A. The above flow is referred to as "replacement gate" (RMG) or "gate-last" flow for advanced CMOS node.

As illustrated in FIG. 2B, the substrate 203 is now to be modified in the gate channel region 207 by a wet etching process to form a shallow trench 219 in the gate channel between spacers 215. The etching process leads to the formation of inner sidewalls 221 in the resulting trench 219. For example, the gate channel region 207 may be modified by anisotropically wet etching the gate channel region to form the trench 219 having a concave channel with inner sidewalls 221. For a silicon substrate, the sidewalls 221 may be bounded by silicon (111) surfaces. Anisotropically wet etching the gate channel 207 may be accomplished with any suitable reagents, for example tetramethylammonium hydroxide (TMAH or $(CH_3)_4NOH$) or ammonium hydroxide ($NH_4OH$). Using the wet etching process, the gate channel 207 may be anisotropically wet etched to a depth of 5 to 8 nm, with sidewalls surface at an angle of 54.7 degrees with respect to the flat substrate surface (i.e., the characteristic angle between Si crystal surface (111) and (100).

In FIG. 2C, the substrate 203 is further modified in the SIT regions 211 to form outer sidewalls 223 on the trench 219. For an anisotropically wet etched gate channel region 207 having a concave channel with inner sidewalls 221, the outer sidewalls 223 can be formed by recessing the STI regions 211 adjacent to the concave channel. Recessing the STI regions 211 can expose the outer sidewalls 223 of the concave channel to a depth of 3 to 10 nm.

Figure 3A:
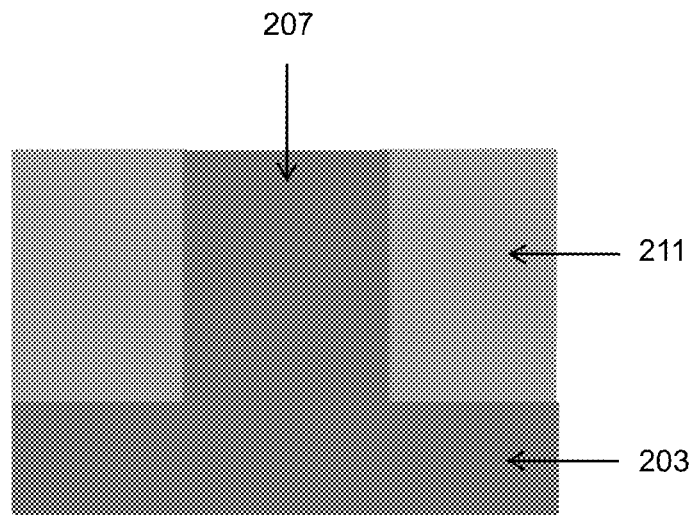
FIGS. 3A through 3C illustrate a cross-sectional view of process steps for fabricating a planar transistor with longer effective channel length, according to an exemplary embodiment.
Figure 3B:
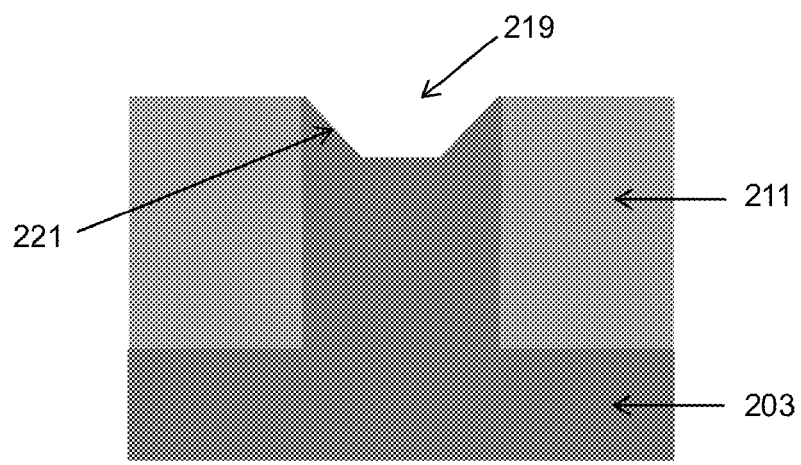
Figure 3C:
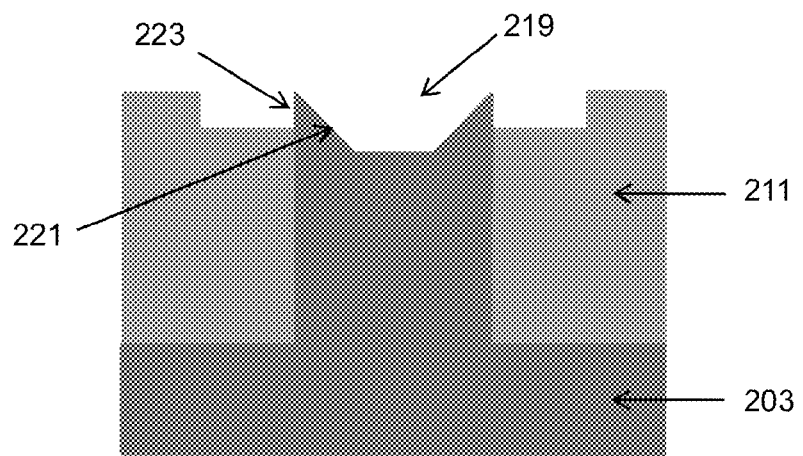

FIGS. 3A through 3C illustrate a cross-sectional view of the device 201 along line 3A-3A (the channel width) in FIG. 2C, according to the steps shown in FIGS. 2A through 2C, respectively. In FIG. 3A, the device 201 includes the semiconductor substrate 203 having channel 207 region, and the SIT regions 211. In FIG. 3B, the substrate 203 is modified in the gate channel region 207 by an anisotropic wet etching process to form a trench 219 in the gate channel, Which leads to the formation of inner sidewalk 221 in the resulting trench 219. In FIG. 3C, the substrate 203 is further modified by recessing the ST1 regions 211 to form outer sidewalls 223 on the trench 219.

Figure 4:
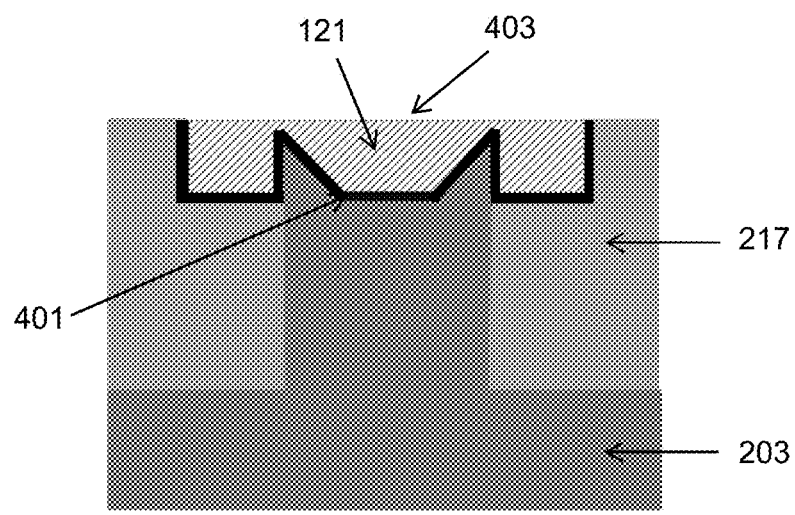
FIG. 4 illustrates a cross-sectional view of a planar transistor device according to an exemplary embodiment.

FIG. 4 illustrates a cross-sectional view of the planar transistor device which results after formation of the high-k metal gate over the device of FIG. 3C. For example, a gate oxide layer (not shown for illustrative convenience) is formed on the gate channel region 207 of the substrate 203; a conformal high-k dielectric layer 401 is deposited on the gate oxide layer and the trench region 219 (including the inner sidewalls 221 and outer sidewalls 223 of the substrate 203); and a metal gate 403 is deposited in the trench 219.

Figure 5:
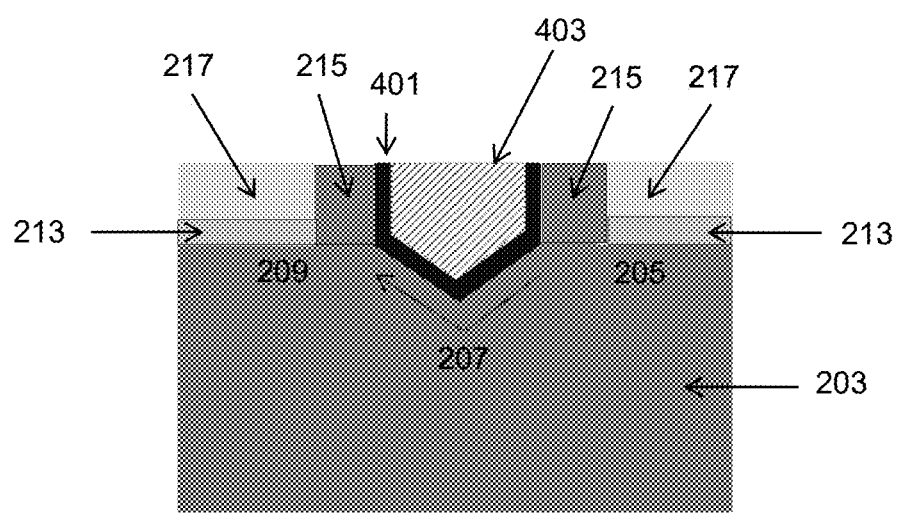
FIG. 5 illustrates a side view of a planar transistor device according to an exemplary embodiment.

FIG. 5 illustrates a cross-sectional view of the planar transistor device of FIG. 4 along line 5-5' in FIG. 3C (the channel length). As shown, the device includes the metal gate 403, with the conformal high-k dielectric layer 401 and source and drain regions 205 and 209, respectively. Also shown are the spacers 215, the ILD 217, and epi overgrowth portions 213 over the source and drain regions. The inner sidewalls 221 and the outer sidewalls 223 on the trench 219 effectively increase the length of the channel (gate length). That is, the channel width and length are increased due to the recess which effectively increases the path length of the channel (see arrow).

The embodiments of the present disclosure can achieve several technical effects, such as new transistor structures for min-size high-k/metal-gate n- and/or p-FETs in SRAM cells with an increased effective channel length, with the advantages of low etching damage, lower Vtmm, higher Vt, reduced short channel effects and leakage; smaller RMG gate resistance, and a simple manufacturing process. Devices formed in accordance with embodiments of the present disclosure are useful in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any of various types of highly integrated semiconductor devices, particularly for 20 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method, comprising:
    forming a dummy gate bound by spacers on opposing sides thereof, on a substrate;
    removing the dummy gate to form a trench between the spacers;
    modifying a gate channel portion of the substrate by anisotropically wet etching the gate channel portion of the substrate to form a concave channel with inner sidewalls;
    depositing a conformal high-k dielectric layer on the modified gate channel portion; and
    forming a metal gate in the trench.

2. The method according to claim 1, comprising anisotropically wet etching the gate channel portion of the substrate with tetramethylammonium hydroxide (TMAH or (CH$_3$)$_4$NOH) or ammonium hydroxide (NH$_4$OH).

3. The method according to claim 2, comprising anisotropically wet etching the gate channel portion of the substrate to a depth of 5 to 8 nm.

4. The method according to claim 1, wherein the concave channel is bounded by silicon (111) surfaces.

5. The method according to claim 1, further comprising exposing outer sidewalls of the concave channel by recessing an oxide shallow trench isolation (STI) region adjacent the concave channel.

6. The method according to claim 5, comprising exposing the outer sidewalls of the concave channel to a depth of 3 to 10 nm.

7. The method according to claim 1, comprising modifying the gate channel portion of the substrate by recessing an STI region in the substrate adjacent the gate channel portion to expose outer sidewalls of the gate channel portion.

8. The method according to claim 7, comprising exposing the outer sidewalls of the gate channel portion to a depth of 3 to 10 nm.

9. The method according to claim 1, further comprising removing a gate oxide layer with the dummy gate to form the trench.

10. The method according to claim 1, further comprising forming a gate oxide layer between the modified gate channel portion and the conformal high-k dielectric layer.

11. A device, comprising:
    a substrate;
    a gate channel portion in the substrate having inner or outer sidewalls;
    a conformal high-k dielectric layer over the gate channel portion; and
    a metal gate with spacers at opposite sides thereof over the conformal high-k dielectric layer,
    wherein the gate channel portion is anisotropically wet etched to form a concave channel in the substrate with inner sidewalls.

12. The device of claim 11, wherein the inner sidewalls have a depth of 5 to 8 nm.

13. The device of claim 11, wherein the concave channel is bounded by silicon (111) surfaces.

14. The device of claim 11, further comprising an oxide shallow trench isolation (STI) region adjacent the concave channel, the STI region recessed to expose outer sidewalls on the concave channel.

15. The device of claim 14, wherein the exposed outer sidewalls on the concave channel have a depth of 3 to 10 nm.

16. The device according to claim 11, further comprising an oxide STI region in the substrate adjacent the gate channel portion recessed to expose outer sidewalls of the gate channel portion.

17. The device according to claim 16, wherein the outer sidewalls of the gate channel portion have a depth of 3 to 10 nm.

18. A method, comprising:
    forming a gate oxide layer and a polysilicon dummy gate bounded by spacers on opposing sides thereof and surrounded by an interlayer dielectric (ILD) on a substrate;
    removing the gate oxide layer and the polysilicon dummy gate to form a trench between the spacers;
    anisotropically wet etching a gate channel portion of the substrate between the spacers with tetramethylammonium hydroxide (TMAH or (CH$_3$)$_4$NOH) or ammonium hydroxide (NH$_4$OH) to form a concave channel with inner sidewalls having a depth of 5 to 8 nm, the concave channel being bounded by silicon (111) surfaces;

recessing an oxide shallow trench isolation (STI) region adjacent the concave channel to a depth of 3 to 10 nm to expose outer sidewalls of the gate channel portion; and depositing a high-k dielectric layer and forming a metal gate in the trench.

\* \* \* \* \*